(12) United States Patent
Ito

(10) Patent No.: US 10,850,972 B2
(45) Date of Patent: Dec. 1, 2020

(54) VIBRATOR DEVICE, OSCILLATOR, ELECTRONIC DEVICE, AND VEHICLE

(71) Applicant: SEIKO EPSON CORPORATION, Tokyo (JP)

(72) Inventor: Hisahiro Ito, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 472 days.

(21) Appl. No.: 15/914,979

(22) Filed: Mar. 7, 2018

(65) Prior Publication Data

US 2018/0265349 A1  Sep. 20, 2018

(30) Foreign Application Priority Data

Mar. 14, 2017  (JP) .................................. 2017-048332

(51) Int. Cl.
| | | |
|---|---|---|
| B81B 7/00 | (2006.01) | |
| H03B 5/32 | (2006.01) | |
| B81B 3/00 | (2006.01) | |
| H03H 9/19 | (2006.01) | |
| H03H 9/05 | (2006.01) | |
| H03H 9/10 | (2006.01) | |

(52) U.S. Cl.
CPC .......... *B81B 7/0058* (2013.01); *B81B 3/0024* (2013.01); *B81B 3/0086* (2013.01); *B81B 7/007* (2013.01); *H03B 5/32* (2013.01); *H03H 9/0519* (2013.01); *H03H 9/0533* (2013.01); *H03H 9/0547* (2013.01); *H03H 9/1021* (2013.01); *H03H 9/19* (2013.01)

(58) Field of Classification Search
CPC ..... B81B 7/0058; B81B 7/007; B81B 3/0024; B81B 3/0086; H03H 9/0547; H03H 9/0519; H03H 9/0533; H03H 9/1021; H03H 9/19; H03H 9/02244; H03H 9/1057; H03H 9/2405; H03B 5/32
See application file for complete search history.

(56) References Cited

U.S. PATENT DOCUMENTS

| | | | |
|---|---|---|---|
| 8,022,554 B2 | 9/2011 | Gupta et al. | |
| 2005/0056458 A1* | 3/2005 | Sugiura | .................... H03B 5/36 174/260 |
| 2007/0290364 A1 | 12/2007 | Gupta et al. | |
| 2011/0233694 A1* | 9/2011 | Yoshida | ............... H03H 9/1014 257/418 |
| 2020/0058568 A1* | 2/2020 | Kawagoe | ................ H01L 23/13 |

* cited by examiner

*Primary Examiner* — Emily P Pham
(74) *Attorney, Agent, or Firm* — Oliff PLC

(57) ABSTRACT

A vibrator device includes a base, a vibrator that includes a vibrator element and a vibrator element package, which accommodates the vibrator element and has a first terminal on a surface on a base side, a circuit element that is disposed between the base and the vibrator and has a first connection pad on a surface on a vibrator side, and a conductive connecting member that is disposed between the circuit element and the vibrator, bonds the circuit element and the vibrator together, and electrically connects the first connection pad and the first terminal together.

12 Claims, 11 Drawing Sheets

VIBRATOR DEVICE, OSCILLATOR, ELECTRONIC DEVICE, AND VEHICLE

BACKGROUND

1. Technical Field

The present invention relates to a vibrator device, an oscillator, an electronic device, and a vehicle.

2. Related Art

For example, a COL package structure that has a lead, a control chip disposed on the lead, and an MEMS chip disposed on the control chip is disclosed in U.S. Unexamined Patent Application Publication No. 2007/0290364.

However, in the COL package structure of U.S. Unexamined Patent Application Publication No. 2007/0290364, the control chip and the MEMS chip are electrically connected to each other via a wire, and the wire is wired to the top surface of the MEMS chip. For this reason, making the height of the COL package structure low is inhibited by the wire.

SUMMARY

An advantage of some aspects of the invention is to provide a vibrator device, an oscillator, an electronic device, and a vehicle, which can achieve a low height.

The advantage can be achieved by the following configurations.

A vibrator device according to an aspect of the invention includes a base, a vibrator that is disposed so as to overlap the base and includes a vibrator element and a vibrator element package, which accommodates the vibrator element and has a first terminal on a surface on a base side, a circuit element that is disposed between the base and the vibrator and has a first connection pad on a surface on a vibrator side, and a conductive connecting member that is disposed between the circuit element and the vibrator, bonds the circuit element and the vibrator together, and electrically connects the first connection pad and the first terminal together.

With this configuration, the height of the vibrator device can be made low.

In the vibrator device according to the aspect of the invention, it is preferable that the circuit element includes an active surface, an insulating layer disposed on the active surface on the vibrator side, and a wiring layer that is disposed on the insulating layer on the vibrator side and has the first connection pad.

With this configuration, the disposition of the first connection pad can be freely set.

In the vibrator device according to the aspect of the invention, it is preferable that the base has a second terminal, and the circuit element has a second connection pad on the surface on the vibrator side and a wire that electrically connects the second terminal and the second connection pad together.

With this configuration, the second terminal and the second connection pad can be electrically connected together more easily. In addition, since electrical connection with the circuit element is performed via the since second terminal, it is easy to mount the vibrator device.

In the vibrator device according to the aspect of the invention, it is preferable that the second connection pad is disposed so as not to overlap the vibrator in plan view seen from a direction where the base, the circuit element, and the vibrator are arranged.

With this configuration, the wire can be more easily connected to the second connection pad.

In the vibrator device according to the aspect of the invention, it is preferable that a height of the wire from the base is lower than a height of the vibrator from the base.

With this configuration, an increase in the height of the vibrator device can be suppressed.

In the vibrator device according to the aspect of the invention, it is preferable that the vibrator element package has a base body having the first terminal and a lid bonded to the base body so as to form an accommodation space accommodating the vibrator element between the lid and the base body.

With this configuration, the configuration of the vibrator element package is simple.

In the vibrator device according to the aspect of the invention, it is preferable that the circuit element has a third connection pad that is disposed on the surface on the vibrator side and is electrically connected to the first connection pad, and the third connection pad is disposed so as not to overlap the vibrator in plan view seen from a direction where the base, the circuit element, and the vibrator are arranged.

With this configuration, since drive inspection of the vibrator element can be performed via the third connection pad, inspection of the vibrator device can be easily performed.

In the vibrator device according to the aspect of the invention, it is preferable that a mold portion that is disposed on the base and covers the vibrator and the circuit element is further included.

With this configuration, the vibrator and the circuit element can be protected from moisture, dust, and shock, and thus the reliability of the vibrator device improves.

In the vibrator device according to the aspect of the invention, it is preferable that a mold portion that is disposed on the base and covers the vibrator and the circuit element is further included, the circuit element has a third connection pad that is disposed on the surface on the vibrator side and is electrically connected to the first connection pad, the third connection pad is disposed so as not to overlap the vibrator in plan view seen from a direction where the base, the circuit element, and the vibrator are arranged, and the third connection pad is closer to a center of the circuit element than the second connection pad is in the plan view.

With this configuration, since the third connection pad can be easily exposed by removing the mold portion around the resonator, inspection of the vibrator device can be more easily performed.

An oscillator according to an aspect of the invention includes the vibrator device according to the aspect of the invention.

With this configuration, the oscillator, in which an effect of the vibrator device according to the aspect of the invention can be enjoyed and which has high reliability, is obtained.

An electronic device according to an aspect of the invention includes the vibrator device according to the aspect of the invention.

With this configuration, the electronic device, in which an effect of the vibrator device according to the aspect of the invention can be enjoyed and which has high reliability, is obtained.

A vehicle according to an aspect of the invention includes the vibrator device according to the aspect of the invention.

With this configuration, the vehicle, in which an effect of the vibrator device according to the aspect of the invention can be enjoyed and which has high reliability, is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a vibrator device, an oscillator, an electronic device, and a vehicle according to the invention will be described in detail based on embodiments illustrated in the attached drawings.

First Embodiment

First, an oscillator (vibrator device) according to a first embodiment of the invention will be described.

Figure 1:
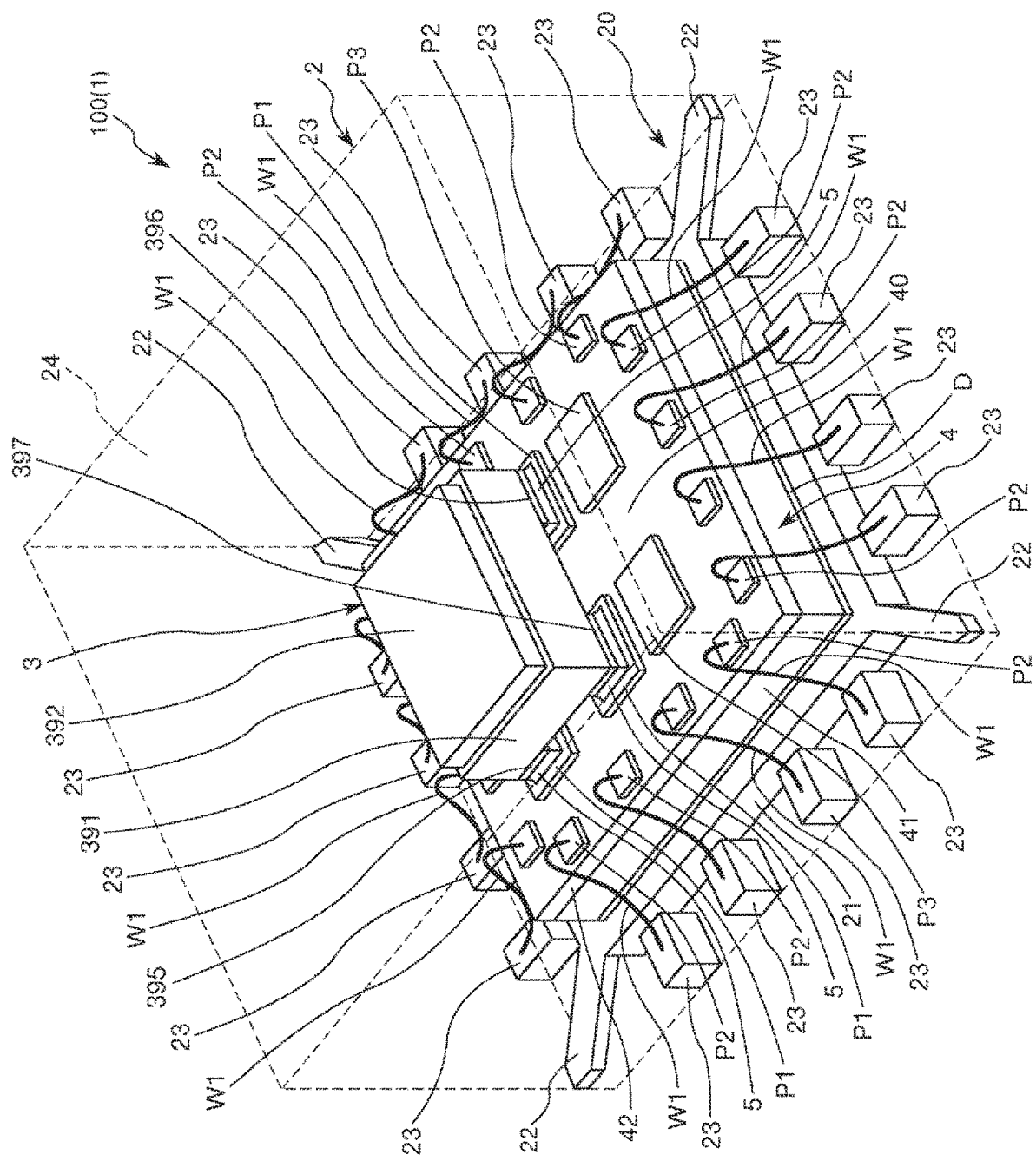
FIG. 1 is a perspective view illustrating an oscillator (vibrator device) according to a first embodiment of the invention.
Figure 2:
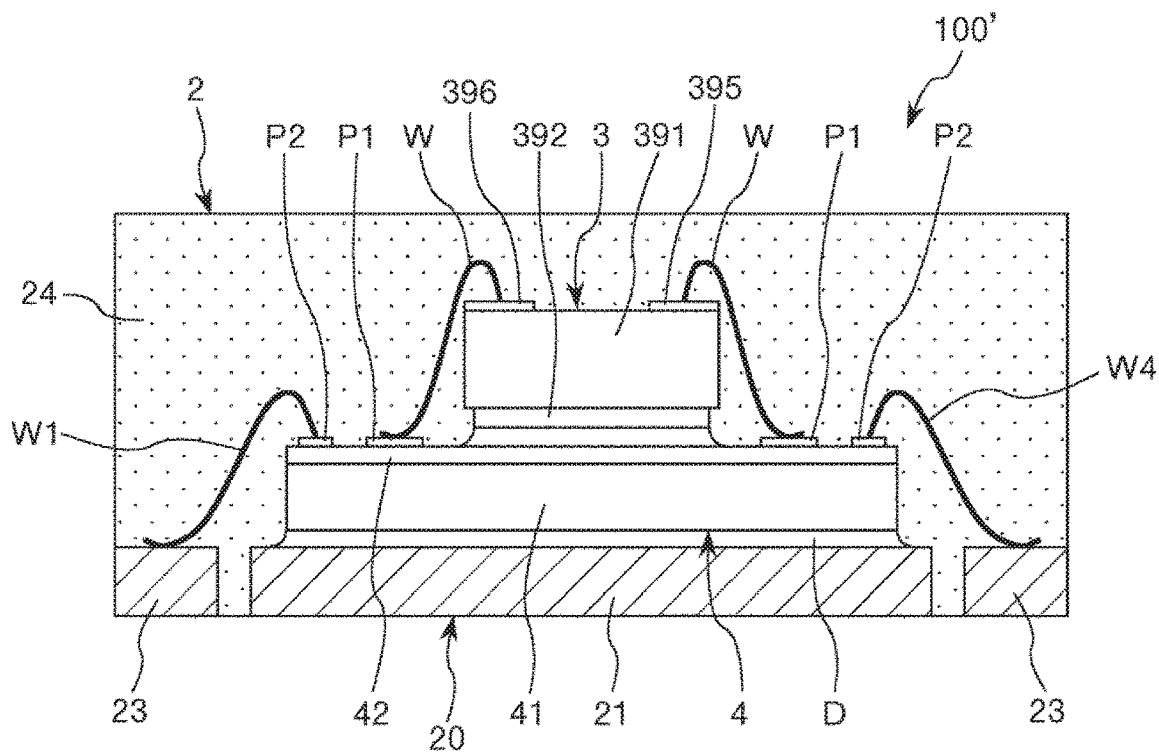
FIG. 2 is a sectional view illustrating an oscillator of the related art.
Figure 3:
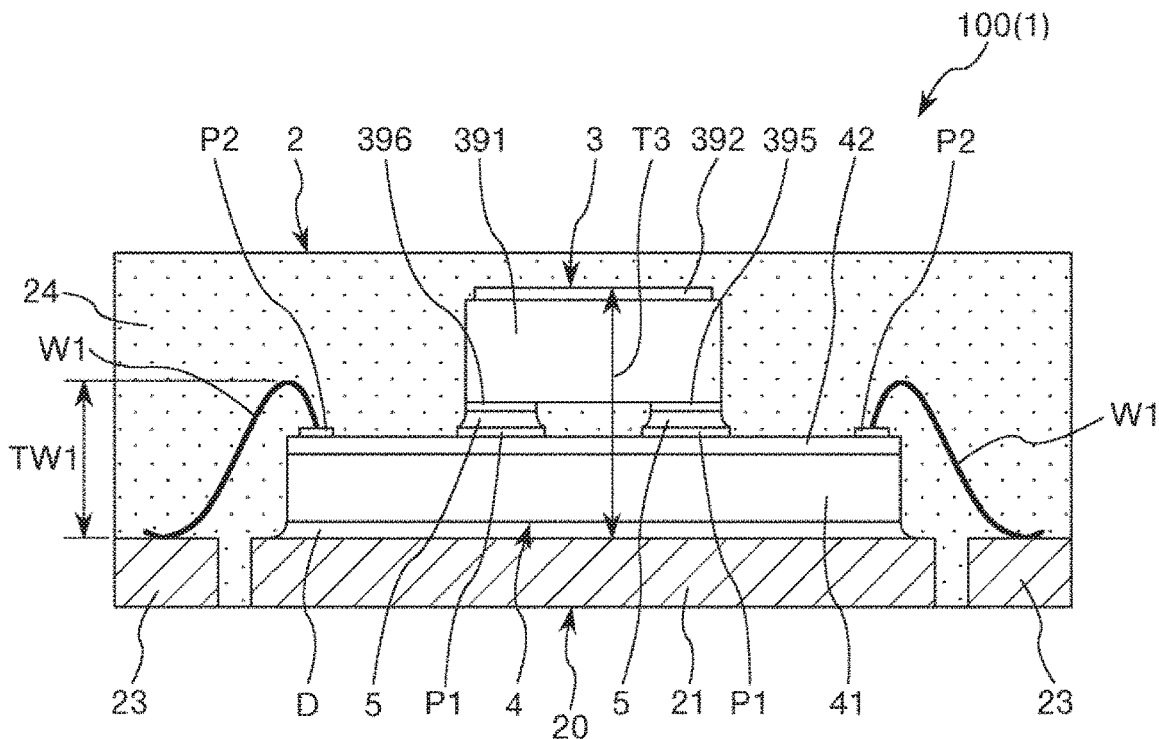
FIG. 3 is a sectional view of the oscillator illustrated in FIG. 1.
Figure 4:
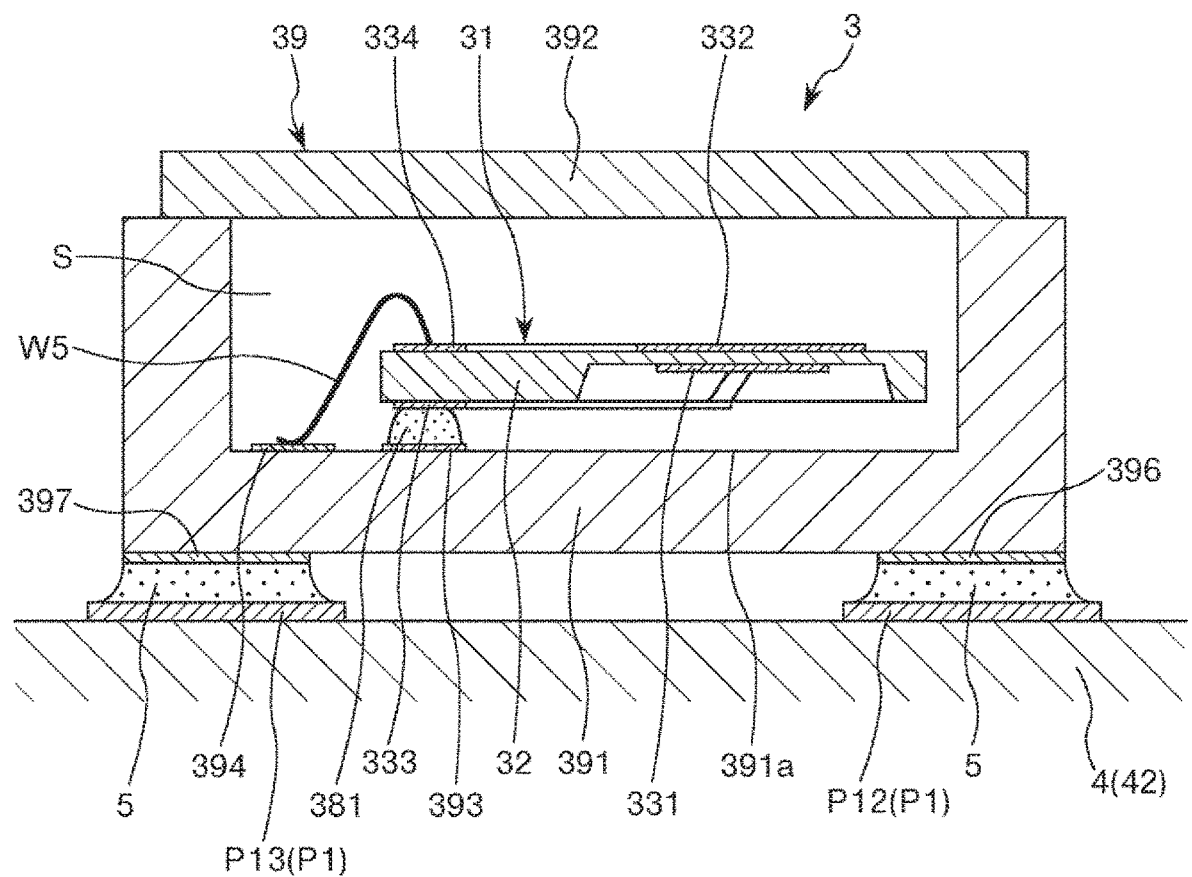
FIG. 4 is a sectional view of a vibrator of the oscillator illustrated in FIG. 1.
Figure 5:
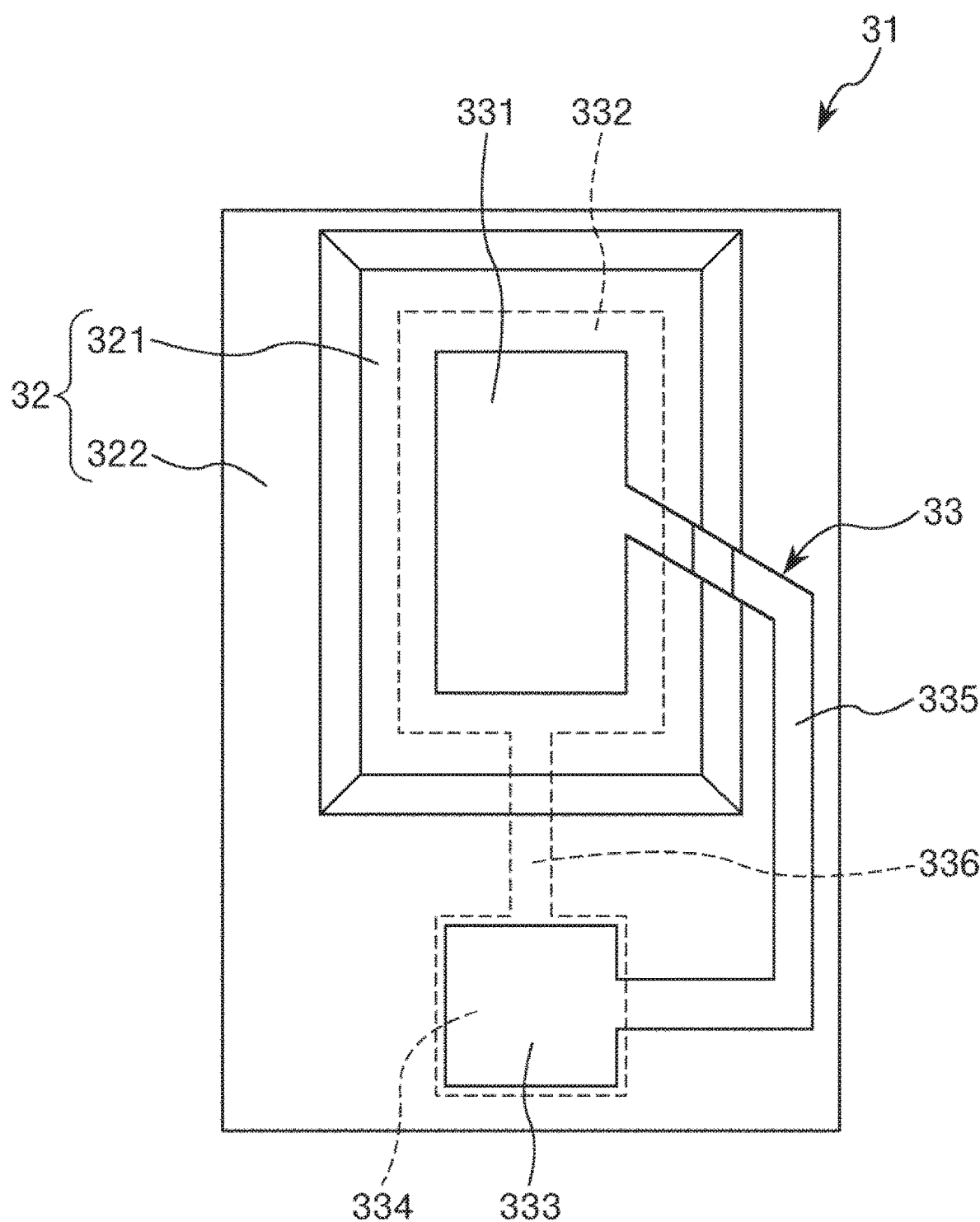
FIG. 5 is a plan view of a vibrator element of the vibrator illustrated in FIG. 4.
Figure 6:
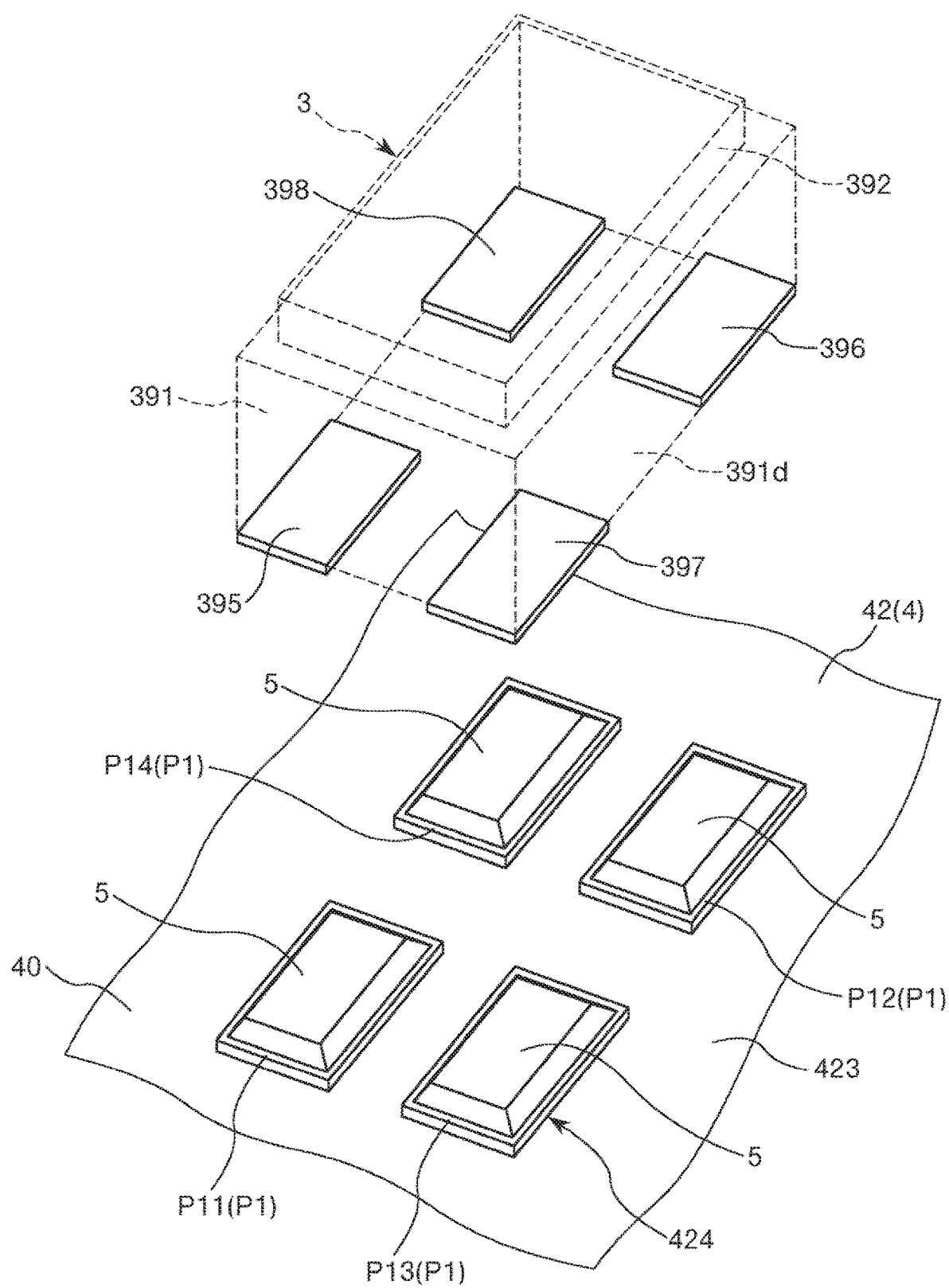
FIG. 6 is a perspective view of the vibrator illustrated in FIG. 4.
Figure 7:
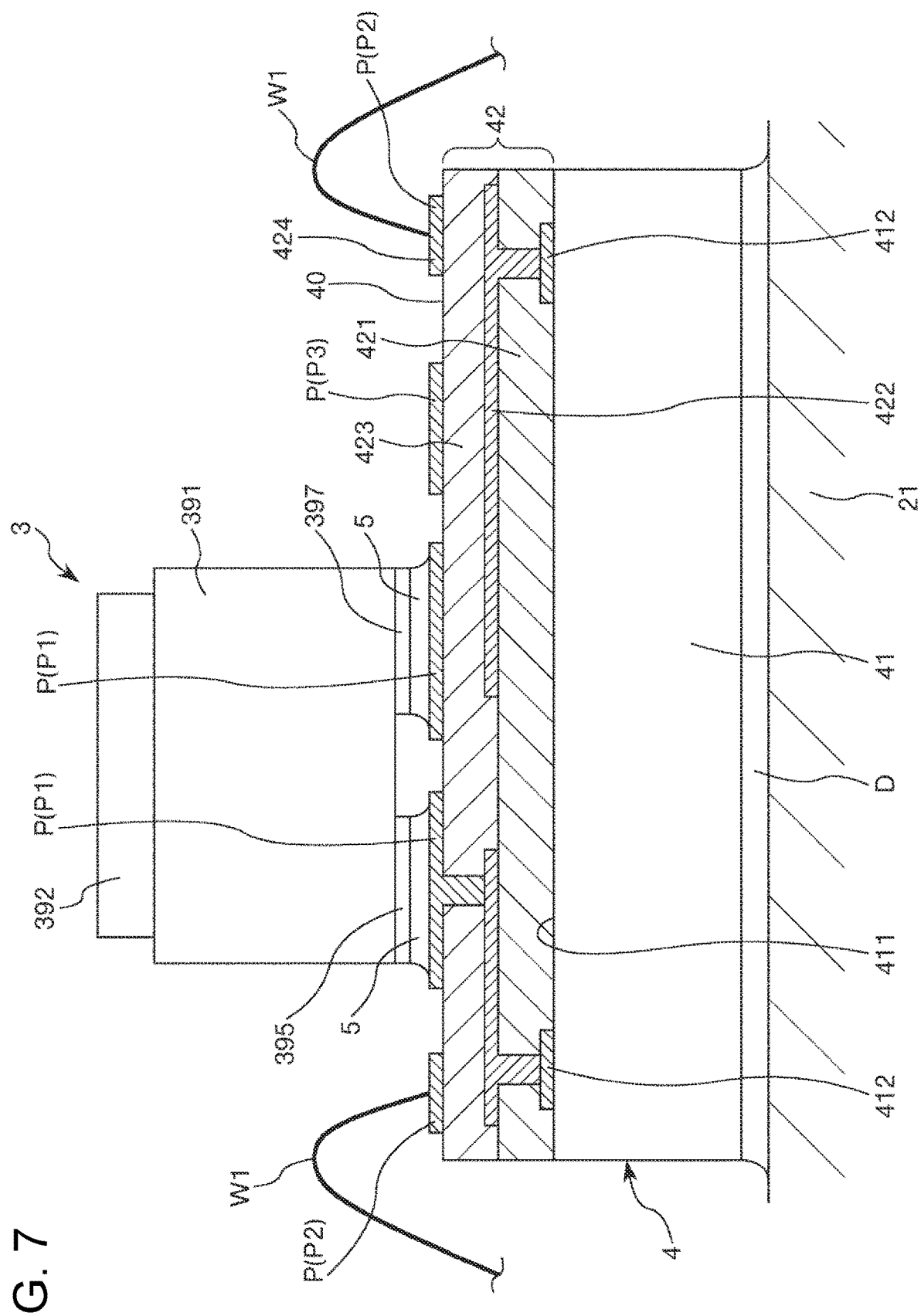
FIG. 7 is a sectional view of a circuit element of the oscillator illustrated in FIG. 1.
Figure 8:
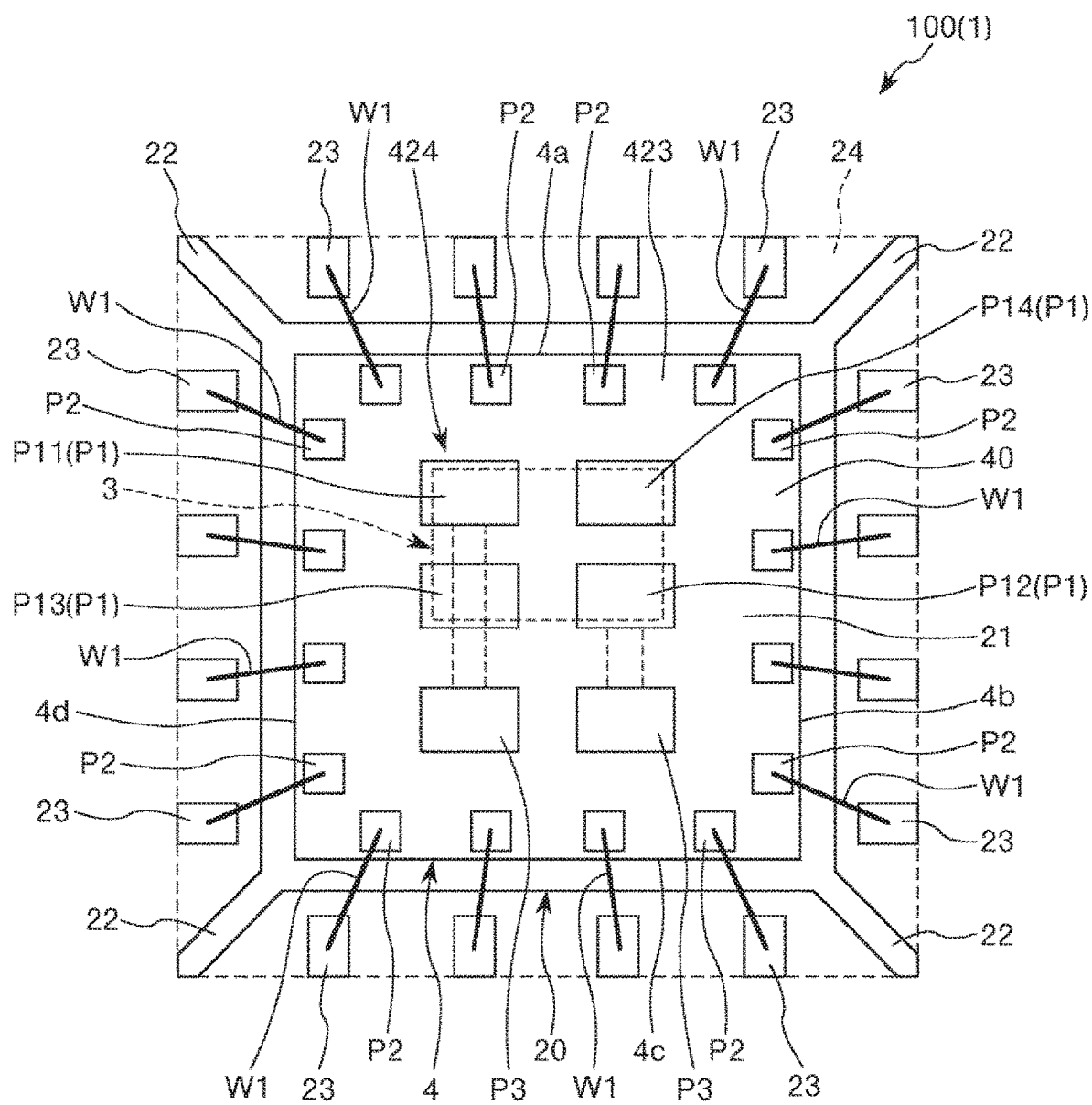
FIG. 8 is a plan view of the oscillator illustrated in FIG. 1.

FIG. 1 is a perspective view illustrating the oscillator (vibrator device) according to the first embodiment of the invention. FIG. 2 is a sectional view illustrating an oscillator of the related art. FIG. 3 is a sectional view of the oscillator illustrated in FIG. 1. FIG. 4 is a sectional view of a vibrator of the oscillator illustrated in FIG. 1. FIG. 5 is a plan view of a vibrator element of the vibrator illustrated in FIG. 4. FIG. 6 is a perspective view of the vibrator illustrated in FIG. 4. FIG. 7 is a sectional view of a circuit element of the oscillator illustrated in FIG. 1. FIG. 8 is a plan view of the oscillator illustrated in FIG. 1. Hereinafter, for convenience of description, an upper side in FIGS. 1, 2, 3, 4, 6, and 7 and a page front side in FIGS. 5 and 8 will also be referred to as "up", and a lower side in FIGS. 1, 2, 3, 4, 6, and 7 and a page depth side of FIGS. 5 and 8 will also be referred to as "down".

A vibrator device 1 illustrated in FIG. 1 is applied to an oscillator 100, and mainly includes a package 2, a vibrator 3, and a circuit element 4. The vibrator 3 is disposed on the circuit element 4. If the vibrator 3 and the circuit element 4 are electrically connected to each other via wires W as in an oscillator 100' of the related art illustrated in FIG. 2, loops of the wires W are positioned above the vibrator 3. For this reason, the oscillator 100' is thick. In addition, a connecting portion between the vibrator 3 and the wires W becomes brittle over time due to vibration occurred from the vibrator 3 and thus there is also a possibility that electrical connection becomes unstable. Thus, in the oscillator 100, the vibrator 3 and the circuit element 4 are electrically connected to each other via connecting members 5 positioned between the vibrator and the circuit element as illustrated in FIGS. 1 and 3. Consequently, the vibrator 3 and the circuit element 4 can be electrically connected to each other without disposing the wires W illustrated in FIG. 2. For this reason, the oscillator 100 can be made thin compared to a configuration illustrated in FIG. 2. That is, the height of the oscillator 100 can be made low. In addition, electrical connection can be stably maintained. Hereinafter, such an oscillator 100 (vibrator device 1) will be described in detail.

Package

The package 2 is a quad flat non-leaded (QFN) package, and is in a substantially quadrilateral block shape (plate shape) in plan view. Such a package 2 has a base 20 and a mold portion 24 (sealing portion) as illustrated in FIGS. 1 and 3. The base 20 has a die pad 21 (mounting portion) having a substantially quadrilateral plate shape in plan view, four hanging leads 22 connected to corners of the die pad 21, and the plurality of leads 23 (second terminals) disposed along the perimeter of the die pad 21. However, the configuration of the base 20 is not particularly limited. For example, the die pad 21 may not be a substantially quadrangle in plan view.

As illustrated in FIGS. 1 and 3, the circuit element 4 is bonded and fixed to the top surface of the die pad 21 via a die attach member D. The vibrator 3 is bonded and fixed to the top surface of the circuit element 4 via the conductive connecting members 5. The plurality of leads 23 and the circuit element 4 are electrically connected to each other via wires W1, and the circuit element 4 and the vibrator 3 are electrically connected to each other via the connecting members 5. The wires W1 are, for example, bonding wires disposed (formed) using a wire bonding technique. Metal wires, for example, a gold wire, a copper wire, and an aluminum wire can be used as the wires W1.

The mold portion 24 is provided on the top surface of the base 20 so as to seal the vibrator 3, the circuit element 4, and the wires W1. Consequently, each of the units can be effectively protected from moisture, dust, and shock, and thus the reliability of the oscillator 100 improves. The configuration materials of the mold portion 24 are not particularly limited. For example, an epoxy based thermosetting resin can be used and a thermosetting resin may contain a filler such as silica.

As illustrated in FIG. 1, each of the four hanging leads 22 extends from a corner of the die pad 21 to each corner of the package 2, and the die pad 21 is supported by the four hanging leads 22. Each of the hanging leads 22 is formed so as to be thinner than the die pad 21 by half etching a bottom surface thereof. The bottom surface of each of the hanging leads 22 is covered with the mold portion 24. Consequently, since each of the hanging leads 22 is not exposed from the bottom surface of the package 2, the mountability of the oscillator 100 improves.

As illustrated in FIG. 1, the plurality of leads 23 are disposed along four sides of the package 2 in plan view of the package 2. However, the disposition of the leads 23 is not particularly limited. For example, the leads may be disposed along one side of the package 2, may be disposed along two sides, or may be disposed along three sides, or one lead may be disposed for each side. The number of the leads 23 is not particularly limited as well, and can be set as appropriate according to a device configuration (for example, the number of terminals of the circuit element 4).

The bottom surface of each of the leads 23 is exposed from the mold portion 24, and the leads are portions (connecting portions) that perform electrical connection with an external device. The top surface of each of the leads 23 is a portion (wire connecting portion) connected to the wires W1.

The package 2 has been described hereinbefore. The configuration material of the base 20 is not particularly limited. Metal materials, such as gold (Au), silver (Ag), platinum (Pt), palladium (Pd), iridium (Ir), copper (Cu), aluminum (Al), nickel (Ni), titanium (Ti), and tungsten (W), and alloys including the metal materials can be given as examples, and out of the materials, one type or a combination (for example, as a stacked object having two or more layers) of two or more types of materials can be used. For example, by patterning one metal plate, the base 20 can be formed collectively with the die pad 21, each of the hanging leads 22, and each of the leads 23.

Vibrator

As illustrated in FIG. 4, the vibrator 3 has a vibrator element 31 and a vibrator element package 39 accommodating the vibrator element 31.

The vibrator element 31 is an AT cut quartz crystal vibrator element that thickness-shear vibrates. Such a vibrator element 31 has an AT cut quartz crystal substrate 32 and an electrode 33 formed on the quartz crystal substrate 32 as illustrated in FIG. 5. The quartz crystal substrate has a thin vibrating portion 321 and a thick portion 322, which is positioned on the perimeter of the vibrating portion 321 and is thicker than the vibrating portion 321. The thin vibrating portion 321 is formed by forming a recessed portion in one surface of the quartz crystal substrate 32.

The electrode 33 has a pair of excitation electrodes 331 and 332, a pair of pad electrodes 333 and 334, and a pair of extraction electrodes 335 and 336. The excitation electrode 331 is disposed on an exterior surface of the vibrating portion 321. On the other hand, the excitation electrode 332 is disposed on an interior surface of the vibrating portion 321 so as to oppose the excitation electrode 331. In such a configuration, a region of the vibrating portion 321 sandwiched between the excitation electrodes 331 and 332 is a vibration region where thickness-shear vibration is excited. The pad electrode 333 is disposed on an exterior surface of the thick portion 322, and the pad electrode 334 is disposed on an interior surface of the thick portion 322 so as to oppose the pad electrode 333. The extraction electrode 335 is disposed on an exterior surface of the quartz crystal substrate 32 and electrically connects the excitation electrode 331 and the pad electrode 333 together. The extraction electrode 336 is disposed on an interior surface of the quartz crystal substrate 32 and electrically connects the excitation electrode 332 and the pad electrode 334 together.

Although the vibrator element 31 has been briefly described hereinbefore, the configuration of the vibrator element 31 is not particularly limited. For example, the vibrator element may be a vibrator element using a quartz crystal substrate cut out at a different cut angle, such as a vibrator element using a Z cut quartz crystal substrate, a vibrator element using an ST cut quartz crystal substrate, and a vibrator element using an SC cut quartz crystal substrate. In addition, the vibrator element may be a vibrator element with a piezoelectric element being disposed on a silicon substrate, or may be a surface acoustic wave (SAW) vibrator with an inter digital transducer (IDT) being disposed on a silicon substrate.

As illustrated in FIG. 4, the vibrator element package 39 has a base body 391 and a lid 392. The base body 391 is in a box shape having a recess 391a which opens to the top surface. The lid 392 is bonded to the top surface of the base body 391 so as to close an opening of the recess 391a. An accommodation space S is formed by closing the recess 391a with the lid 392 and the vibrator element 31 is accommodated in the accommodation space S. The accommodation space S is in, for example, a depressurized (vacuum) state. However, the atmosphere of the accommodation space S is not particularly limited, and can be changed as appropriate according to a configuration of the vibrator element 31.

Although the configuration material of the base body 391 is not particularly limited, various types of ceramics, for example, aluminum oxide, can be used. Although the configuration material of the lid 392 is not particularly limited, the configuration material may be, for example, a material of which linear expansion coefficient is similar to a linear expansion coefficient of the configuration material of the base body 391. For example, in a case where the configuration material of the base body 391 is the ceramic described above, it is preferable to be an alloy such as Kovar.

As illustrated in FIG. 4, internal terminals 393 and 394 are disposed on the bottom of the recess 391a. As illustrated in FIG. 6, external terminals 395 and 396 (first terminals) are disposed on a bottom surface 391d of the base body 391. Via internal wiring (not illustrated) provided in the base body 391, the internal terminal 393 and the external terminal 395 are electrically connected to each other and the internal terminal 394 and the external terminal 396 are electrically connected to each other. In addition, dummy terminals 397 and 398 are provided on the bottom surface 391d of the base body 391. The dummy terminals 397 and 398 are not electrically connected to the vibrator element 31, and are mainly used as terminals for enhancing the strength of bonding with the circuit element 4. The dummy terminals 397 and 398 may be omitted. Although the external terminals 395 and 396 are disposed diagonally on the bottom surface 391d, the disposition of the external terminals 395 and 396 is not particularly limited as well.

As illustrated in FIG. 4, the vibrator element 31 is disposed in the accommodation space S such that the exterior surface (surface on a side where the recessed portion is formed) of the vibrator element faces the base body 391. The vibrator element is fixed to the bottom of the recess 391a by a conductive adhesive 381, and the pad electrode 333 and the internal terminal 393 are electrically connected to each other via the conductive adhesive 381. The pad electrode 334 and the internal terminal 394 are electrically connected to each other via a wire W5. Consequently, electrical connection between the outside of the vibrator element package 39 and the vibrator element 31 can be achieved via the external terminals 395 and 396.

Although the vibrator element package 39 has been described hereinbefore, the configuration of the vibrator element package 39 is not particularly limited. Contrary to the embodiment, for example, the base body 391 may be in a plate shape and the lid 392 may be in a cap shape having a recess (recess that corresponds to the recess 391a of the embodiment) accommodating the vibrator element 31.

With the bottom surface 391d of the base body 391 facing the circuit element 4 (lower side), the vibrator 3 having such a configuration is bonded and fixed to a top surface 40 of the circuit element 4 via the connecting members 5 as illustrated in FIG. 4.

Although the vibrator 3 has been described hereinbefore, the configuration of the vibrator 3 is not particularly limited. For example, the vibrator may be an MEMS chip.

Circuit Element

The circuit element 4 has, for example, an oscillation circuit for oscillating the vibrator element 31, and can output a signal having a predetermined frequency. As illustrated in FIG. 1, such a circuit element 4 is bonded and fixed to the top surface of the die pad 21 via the die attach member D. As described above, the vibrator 3 is bonded and fixed to the top surface 40 of the circuit element 4 via the connecting members 5. That is, the circuit element 4 is positioned between the die pad 21 and the vibrator 3.

As illustrated in FIG. 7, such a circuit element 4 has a circuit element main body 41 (IC) having an active surface 411 and a redisposing wiring layer 42 disposed on the active surface 411. Various types of circuits, such as the oscillation circuit described above, are formed in the circuit element main body 41. The redisposing wiring layer 42 has a function of redisposing terminals 412 provided on the active surface 411 of the circuit element main body 41 as connection pads P. By having such a redisposing wiring layer 42, the disposition of the connection pads P can be freely set. For this reason, various types of circuits having different disposition of the terminals 412 can be used as the circuit element main body 41. That is, it is not necessary to design the circuit element main body 41 exclusive to the oscillator 100. Accordingly, for example, the cost of the oscillator 100 can be reduced.

In addition, the redisposing wiring layer 42 has a first insulating layer 421 stacked on the active surface 411 of the circuit element main body 41, a first wiring layer 422 that is stacked on the first insulating layer 421 and is electrically connected to the terminals 412, a second insulating layer 423 stacked on the first insulating layer 421 and the first wiring layer 422, and a second wiring layer 424 that is stacked on the second insulating layer 423 and is electrically connected to the first wiring layer 422. The configuration of the redisposing wiring layer 42 is not particularly limited. For example, the redisposing wiring layer may have one insulating layer and one wiring layer, or may have three or more insulating layers and three or more wiring layers.

Configuration materials of the first and second insulating layers 421 and 423 are not particularly limited. For example, various types of resin materials, such as polyimide, an epoxy resin, an acrylic resin, and a phenol resin, and silicon oxide can be used. In addition, configuration materials of the first and second wiring layers 422 and 424 are not particularly limited. For example, various types of metals such as gold (Au), platinum (Pt), copper (Cu), aluminum (Al), and magnesium (Mg), and alloys including at least one type of the metals can be used.

In addition, the second wiring layer 424 has the plurality of connection pads P. The plurality of connection pads P include a plurality of first connection pads P1, a plurality of second connection pads P2, and a plurality of third connection pads P3. That is, the circuit element 4 has the plurality of first connection pads P1, the plurality of second connection pads P2, and the plurality of third connection pads P3, on the top surface 40 (surface on a vibrator 3 side) thereof. Each of the first connection pads P1 is a terminal connected to the vibrator 3, each of the second connection pads P2 is a terminal connected to each of the leads 23, and each of the third connection pads P3 is a terminal for inspection. In addition, each of the third connection pads P3 is positioned closer to the center of the circuit element 4 than each of the second connection pads P2 is.

As illustrated in FIG. 8, the second wiring layer 424 has the four first connection pads P1 (P11, P12, P13, and P14). In addition, as illustrated in FIG. 6, each of the four first connection pads P1 is disposed so as to oppose each of the external terminals 395 and 396 and the dummy terminals 397 and 398 of the vibrator 3. Specifically, the first connection pad P11 is disposed so as to oppose the external terminal 395, the first connection pad P12 is disposed so as to oppose the external terminal 396, the first connection pad P13 is disposed so as to oppose the dummy terminal 397, and the first connection pad P14 is disposed so as to oppose the dummy terminal 398. The number of the first connection pads P1 is not particularly limited, and can be set as appropriate according to the number of external terminals and dummy terminals of the vibrator 3.

In addition, each of the conductive connecting members 5 is provided between the first connection pad P11 and the external terminal 395, between the first connection pad P12 and the external terminal 396, between the first connection pad P13 and the dummy terminal 397, and between the first connection pad P14 and the dummy terminal 398. The vibrator 3 and the circuit element 4 are bonded together via the connecting members 5, and each pair of the first connection pad P11 and the external terminal 395, the first connection pad P12 and the external terminal 396, the first connection pad P13 and the dummy terminal 397, and the first connection pad P14 and the dummy terminal 398 is electrically connected together via each of the connecting members 5.

The conductive connecting members 5 are not particularly limited. For example, a conductive adhesive obtained by mixing a conductive filler into various types of epoxy-based, acryl-based, and silicone-based adhesives, solder, and a metal brazing material can be used.

Each of the first connection pads P11, P12, P13, and P14 is electrically connected to each of the terminals 412 (that is, a circuit formed on the circuit element main body 41) of the circuit element main body 41 via the first wiring layer 422. Consequently, the vibrator element 31 and the circuit element main body 41 can be electrically connected to each other. It is preferable that each of the first connection pads P13 and P14, which are not electrically connected to the vibrator element 31, is connected to ground and potentials remain constant. Consequently, a change in the potentials of the first connection pads P13 and P14 due to an effect from the surroundings can be suppressed and noises are unlikely to occur. Thus, the reliability of the oscillator 100 improves. However, the first connection pads P13 and P14 may not be electrically connected to the circuit element main body 41, or may be in an electrically floating state.

As illustrated in FIG. 8, the second wiring layer 424 has the sixteen second connection pads P2. In addition, each of the second connection pads P2 is electrically connected to each of the terminals 412 via the first wiring layer 422. The second connection pads P2 are disposed along an outer periphery of the top surface 40 of the circuit element 4 in plan view of the circuit element 4. Specifically, the second connection pads P2 are disposed along each of the four sides 4a, 4b, 4c, and 4d on the outline of the top surface 40 of the circuit element 4. In order to ensure a space on an outer peripheral portion of the top surface 40 of the circuit element 4 and dispose the second connection pads P2 along each of the sides 4a, 4b, 4c, and 4d, the vibrator 3 is disposed on almost a middle portion of the top surface 40 of the circuit element 4. The disposition and number of the second connection pads P2 are not particularly limited. For example, the second connection pads P2 may be disposed along one side, two sides, or three sides out of the four sides.

Each of the second connection pads P2 is electrically connected to each of the leads 23 via each of the wires W1. Consequently, the circuit element 4 (circuit element main body 41) and the leads 23 can be electrically connected to each other. In particular, each of the second connection pads is disposed so as not to overlap the vibrator 3 in plan view of the circuit element 4. In other words, when the circuit element 4 is seen from above, each of the second connection pads P2 is disposed so as to be exposed from the vibrator 3 without being hidden by the vibrator 3. Consequently, each of the wires W1 can be more easily connected to each of the second connection pads P2.

Each of the wires W1 is disposed so as not to straddle the vibrator 3. In other words, the vibrator 3 is not positioned between each set of the second connection pad P2 and the lead 23 connected with the wire W1. Consequently, the height of the wire W1 (height of an uppermost portion of a loop) can be restricted to be low and thus the height of the oscillator 100 can be made low. In addition, the contact of the wires W1 with the vibrator 3 can be suppressed and damage to the wires W1 can be effectively suppressed.

As illustrated in FIG. 3, a height TW1 of each of the wires W1 from the base 20 is lower than a height T3 of the vibrator 3 from the base 20. In other words, the highest portion of each of the wires W1 is positioned below (base 20 side) the top surface of the vibrator 3. Consequently, since each of the wires W1 does not stick out higher than the top surface of the vibrator 3, an increase in the height of the oscillator 100 can be suppressed. A ratio between the height TW1 and T3 is not particularly limited. For example, the ratio is preferably 0.3 TW1/T3<1.0, more preferably 0.5 TW1/T3≤0.8. Consequently, it can be ensured that the heights TW1 of the wires W1 are appropriate, and the disposition of the wires W1 is simpler.

As illustrated in FIG. 8, the second wiring layer 424 has the two third connection pads P3. Each of the third connection pads P3 is disposed so as not to overlap the vibrator 3 in plan view of the circuit element 4. In other words, when the circuit element 4 is seen from above, each of the third connection pads P3 is disposed so as to be exposed from the vibrator 3 without being hidden under the vibrator 3. One third connection pad P3 is electrically connected to the first connection pad Pl1 via the first wiring layer 422, and the other third connection pad P3 is electrically connected to the first connection pad P12 via the first wiring layer 422. However, each of the third connection pads P3 may be electrically connected to the first connection pad P11 and P12 via the second wiring layer 424 instead of the first wiring layer 422.

Such third connection pads P3 are connection pads for inspection used when inspecting the vibrator 3. If a defect occurs in the oscillator 100 or the oscillator 100 breaks down, in some cases, a probe pin for inspection is directly pushed against the external terminals 395 and 396 of the vibrator 3 and the vibrator element 31 is directly driven to perform inspection in order to find out a cause. In this case, inspection is performed in general in a state where a part of the mold portion 24 is removed by etching and the vibrator 3 is exposed. However, since the external terminals 395 and 396 are hidden between the base body 391 and the circuit element 4 in the embodiment, the external terminals 395 and 396 are not exposed and thus the probe pin cannot be directly pushed against the external terminals 395 and 396.

Thus, in the oscillator 100, the third connection pads P3 electrically connected to the external terminals 395 and 396 are provided so as to press the probe pin against the third connection pads P3. Since the third connection pads P3 are positioned on the top surface 40 of the circuit element 4 so as not to overlap the vibrator 3 as described above, the third connection pads can be easily exposed by removing a part of the mold portion 24 by etching. For this reason, the inspection described above can be more easily performed.

The oscillator 100 to which the vibrator device 1 is applied has been described hereinbefore. As described above, the vibrator device 1 (oscillator 100) has the base 20, the vibrator 3 that is disposed so as to overlap the base 20 and includes the vibrator element 31 and the vibrator element package 39, which accommodates the vibrator element 31 and has the external terminals 395 and 396 (first terminals) on the bottom surface 391d (surface on the base 20 side), the circuit element 4 that is disposed between the base 20 and the vibrator 3 and has the first connection pads P1 (P11 and P12) on the top surface 40 (surface on the vibrator 3 side), and the conductive connecting members 5 that are disposed between the circuit element 4 and the vibrator 3, bond the circuit element 4 and the vibrator 3 together, and electrically connect the first connection pads P1 (P11 and P12) and the external terminals 395 and 396 together. Consequently, the vibrator 3 and the circuit element 4 can be electrically connected to each other without using wires. For this reason, the vibrator device 1 (oscillator 100) can be made thin, for example, compared to the configuration illustrated in FIG. 2 described above. That is, the height of the vibrator device 1 (oscillator 100) can be made low.

As described above, in the vibrator device 1 (oscillator 100), the circuit element 4 has the active surface 411, the first insulating layer 421 (insulating layer) disposed above (vibrator 3 side) the active surface 411, and the second wiring layer 424 (wiring layer) that is disposed above (vibrator 3 side) the first insulating layer 421 and includes the first connection pads Pl. By having such a configuration, the disposition of the first connection pads P1 can be freely set. For this reason, for example, various types of circuits having different disposition of the terminals 412 on the active surface 411 can be used as the circuit element 4. Accordingly, for example, the cost of the vibrator device 1 (oscillator 100) can be reduced.

As described above, in the vibrator device 1 (oscillator 100), the base 20 has the leads 23 (second terminals) and the circuit element 4 has the second connection pads P2 on the top surface 40 (surface on the vibrator 3 side). The vibrator device 1 (oscillator 100) has the wires W1 that electrically connect the leads 23 and the second connection pads P2 together. By using the wires W1 as described above, the leads 23 and the circuit element 4 can be electrically connected to each other easily. Since electrical connection with the circuit element 4 is performed via the leads 23, it is easy to mount the vibrator device 1 (oscillator 100).

As described above, in the vibrator device 1 (oscillator 100), the second connection pads P2 are disposed so as not to overlap the vibrator 3 in plan view (in plan view of the base 20) seen from a direction where the base 20, the circuit element 4, and the vibrator 3 are arranged. Consequently, the wires W1 can be more easily connected to the second connection pads P2. Specifically, since the second connection pads P2 do not overlap the vibrator, the second connection pads P2 are likely to press a capillary and the wires W1 can be more easily connected to the second connection pads P2 during wire bonding.

As described above, in the vibrator device 1 (oscillator 100), the height TW1 of each of the wires W1 from the base 20 is lower than the height T3 of the vibrator 3 from the base 20. Consequently, since the wires W1 do not stick out higher than the top surface of the vibrator 3, an increase in the height of the vibrator device 1 (oscillator 100) can be suppressed.

As described above, in the vibrator device 1 (oscillator 100), the vibrator element package 39 has the base body 391 having the external terminals 395 and 396 and the lid 392 bonded to the base body 391 so as to form the accommodation space S accommodating the vibrator element 31 between the lid and the base body 391. Consequently, the configuration of the vibrator element package 39 is simple.

As described above, in the vibrator device 1 (oscillator 100), the circuit element 4 has the third connection pads P3 that are disposed on the top surface 40 (surface on the vibrator 3 side) and are electrically connected to the first connection pads P1. The third connection pads P3 are disposed so as not to overlap the vibrator 3 in plan view (in plan view of the base 20) seen from the direction where the base 20, the circuit element 4, and the vibrator 3 are arranged. Consequently, since drive inspection of the vibrator element 31 can be performed via the third connection pads P3, the inspection described above can be easily performed.

As described above, the vibrator device 1 (oscillator 100) has the mold portion 24, which is disposed on the base 20 and covers the vibrator 3 and the circuit element 4. Consequently, the vibrator 3 and the circuit element 4 can be protected from moisture, dust, and shock, and thus the reliability of the vibrator device 1 (oscillator 100) improves.

As described above, the vibrator device 1 (oscillator 100) has the mold portion 24, which is disposed on the base 20 and covers the vibrator 3 and the circuit element 4. The circuit element 4 has the third connection pads P3 that are disposed on the top surface 40 (surface on the vibrator 3 side) and are electrically connected to the first connection pads P1. The third connection pads P3 are disposed so as not to overlap the vibrator 3 in plan view seen from the direction where the base 20, the circuit element 4, and the vibrator 3 are arranged. In addition, in plan view, the third connection pads P3 are positioned closer to the center of the circuit element 4 than the second connection pads P2 are. Consequently, the third connection pads P3 can be more easily exposed by removing the mold portion 24, which is on the perimeter of the vibrator 3. For this reason, the inspection described above can be more easily performed.

As described above, the oscillator 100 has the vibrator device 1. For this reason, the effect of the vibrator device 1 described above can be enjoyed and high reliability can be demonstrated.

Although a configuration where the package 2 is a QFN package has been described in the embodiment, the package 2 is not particularly limited. For example, a quad flat package (QFP), a dual flat package (DFP), a ball grid array (BGA), a small outline package (SOP), and a dual flat no-leaded (DFN) package may be used. In addition, for example, a ceramic package such as the vibrator element package 39 may be used.

Although a configuration where the circuit element 4 has the circuit element main body 41 and the redisposing wiring layer 42 is adopted in the embodiment, the configuration of the circuit element 4 is not limited thereto. For example, the redisposing wiring layer 42 may be omitted. In this case, the terminals 412 may be disposed on the active surface 411 so as to have the same disposition as the first connection pads P1, the second connection pads P2, and the third connection pads P3 described above. That is, the terminals 412 may include the first connection pads P1, the second connection pads P2, and the third connection pads P3.

Second Embodiment

Next, an electronic device according to a second embodiment of the invention will be described.

Figure 9:
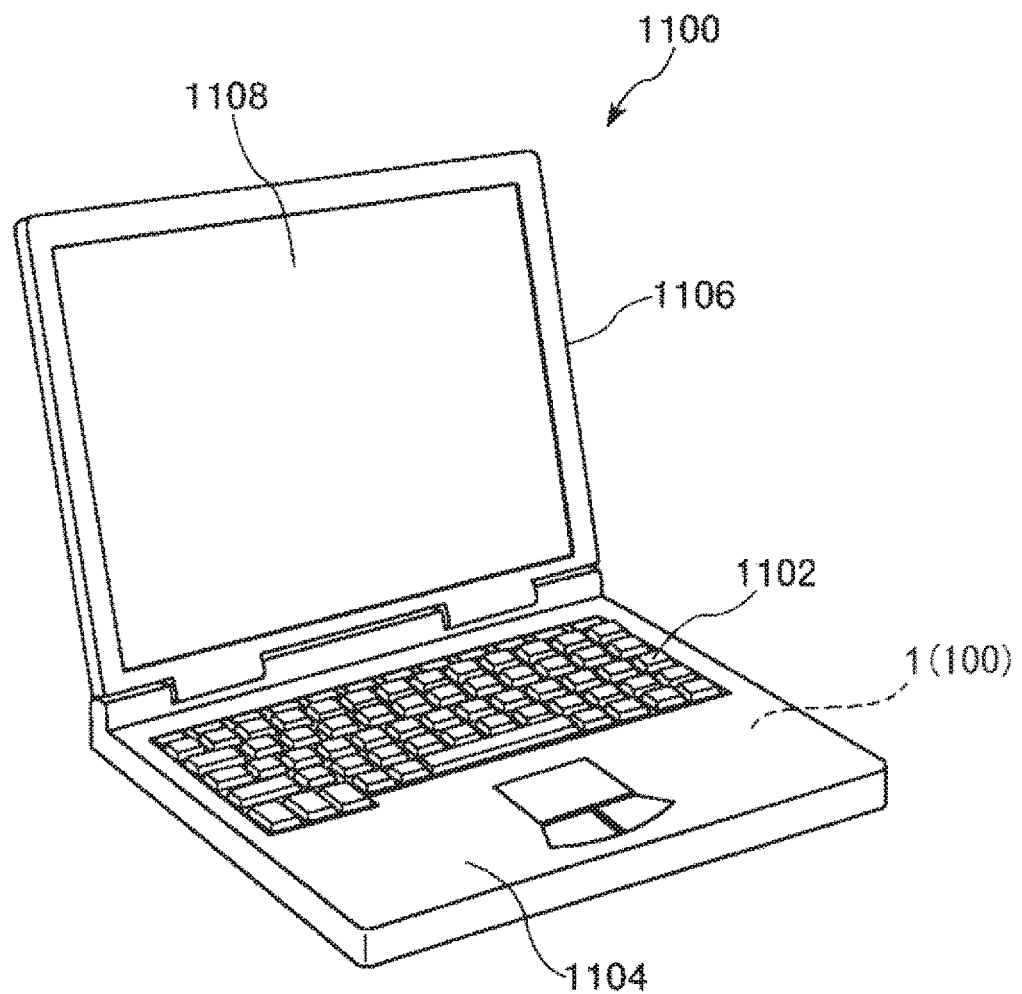
FIG. 9 is a perspective view illustrating an electronic device according to a second embodiment of the invention.

FIG. 9 is a perspective view illustrating the electronic device according to the second embodiment of the invention.

A mobile type (or note type) personal computer 1100 illustrated FIG. 9 is a computer to which the electronic device including the vibrator device according to the invention is applied. In this figure, the personal computer 1100 is configured of a main body unit 1104 including a keyboard 1102 and a display unit 1106 including a display 1108. The display unit 1106 is supported via a hinge structure so as to be rotatable with respect to the main body unit 1104. The oscillator 100 (vibrator device 1) is mounted inside such a personal computer 1100.

Such a personal computer 1100 (electronic device) has the vibrator device 1. For this reason, the effect of the vibrator device 1 described above can be enjoyed and high reliability can be demonstrated.

Third Embodiment

Next, an electronic device according to a third embodiment of the invention will be described.

Figure 10:
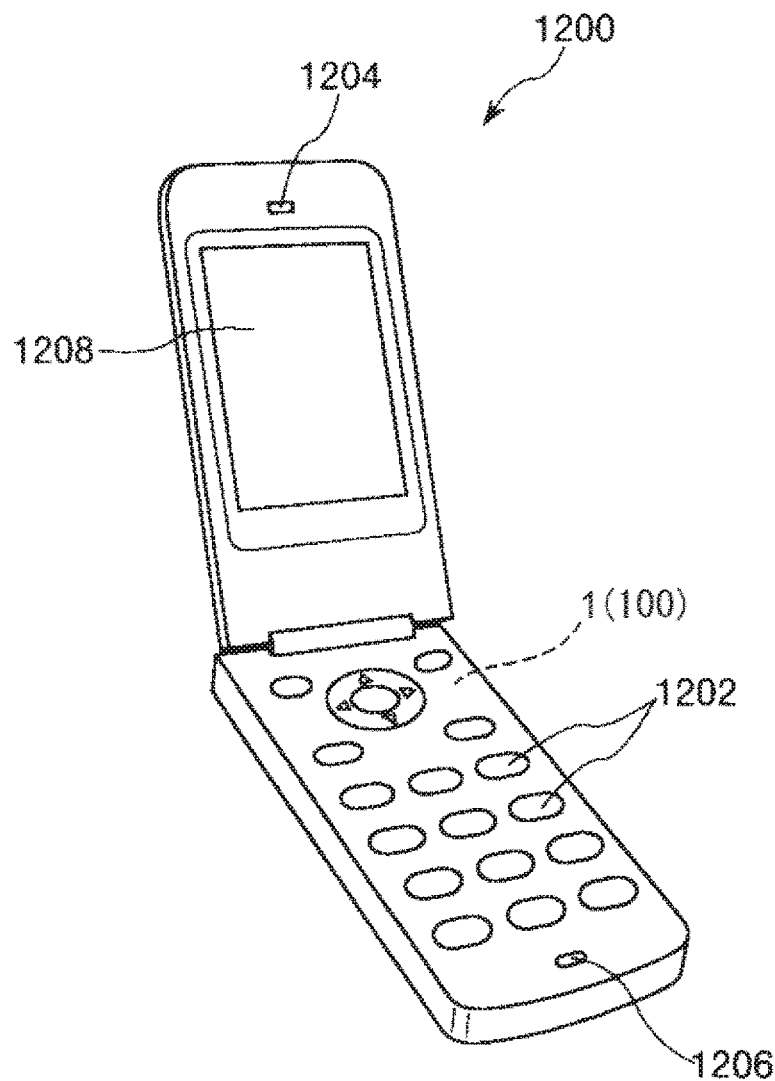
FIG. 10 is a perspective view illustrating an electronic device according to a third embodiment of the invention.

FIG. 10 is a perspective view illustrating the electronic device according to the third embodiment of the invention.

A mobile phone 1200 (including a PHS as well) illustrated in FIG. 10 is a phone to which the electronic device including the vibrator device according to the invention is applied. In this figure, the mobile phone 1200 includes an antenna (not illustrated), a plurality of operation buttons 1202, ear piece 1204, and a mouth piece 1206. A display 1208 is disposed between the operation buttons 1202 and the earpiece 1204. The oscillator 100 (vibrator device 1) is mounted inside such a mobile phone 1200.

Such a mobile phone 1200 (electronic device) has the vibrator device 1. For this reason, the effect of the vibrator device 1 described above can be enjoyed and high reliability can be demonstrated.

Fourth Embodiment

Next, an electronic device according to a fourth embodiment of the invention will be described.

Figure 11:
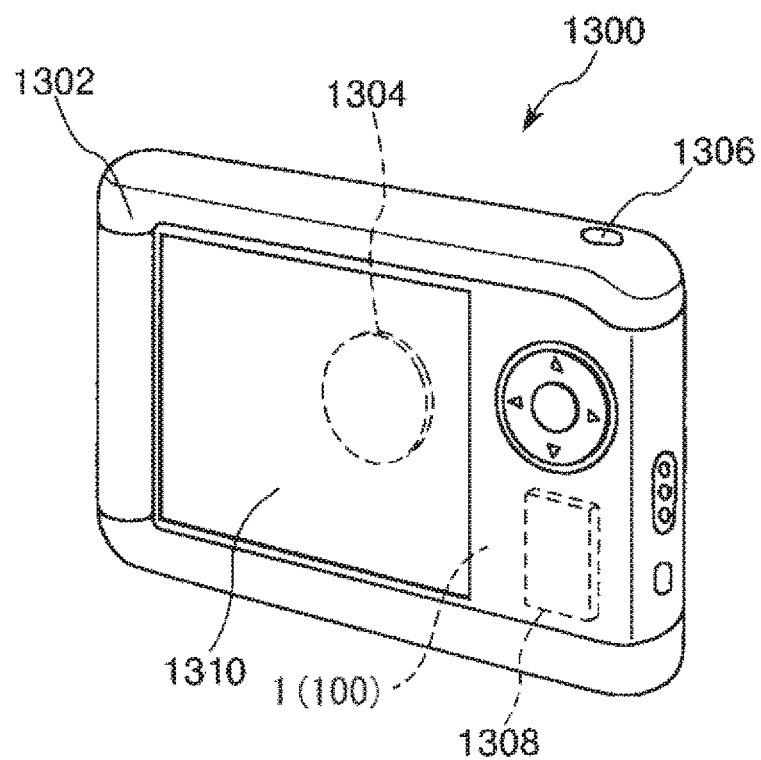
FIG. 11 is a perspective view illustrating an electronic device according to a fourth embodiment of the invention.

FIG. 11 is a perspective view illustrating the electronic device according to the fourth embodiment of the invention.

A digital still camera 1300 illustrated in FIG. 11 is a camera to which the electronic device including the vibrator device according to the invention is applied. In this figure, a display 1310 is provided on the back surface of a case (body) 1302, and is configured to perform display based on an imaging signal from a CCD. The display 1310 functions as a viewfinder displaying a subject as an electronic image. In addition, a light receiving unit 1304 including an optical lens (imaging optical system) and the CCD is provided on a front surface side (interior surface side in this figure) of the case 1302. When a photographer checks a subject image displayed on the display 1310 and presses a shutter button 1306, an imaging signal from the CCD at that time point is transmitted to and is stored in a memory 1308. The oscillator 100 (vibrator device 1) is mounted inside such a digital still camera 1300.

Such a digital still camera 1300 (electronic device) has the vibrator device 1. For this reason, the effect of the vibrator device 1 described above can be enjoyed and high reliability can be demonstrated.

In addition to the personal computer, the mobile phone, and the digital still camera, the electronic device according to the invention can be applied to, for example, a smartphone, a tablet terminal, a watch (including a smartwatch), an ink jet discharging apparatus (for example, an ink jet printer), a laptop personal computer, a television, wearable terminals such as a HMD (head mounted display), a video camera, a video tape recorder, a car navigation device, a pager, an electronic notebook (including an electronic notebook with a communication function as well), an electronic dictionary, a calculator, an electronic game device, a word processor, a workstation, a videophone, a television monitor for crime prevention, an electronic binoculars, a POS terminal, medical devices (for example, an electronic thermometer, a sphygmomanometer, a blood glucose meter, an electrocardiogram measuring device, an ultrasonic diagnostic apparatus, and an electronic endoscope), a fish finder, various types of measuring devices, a mobile terminal base station apparatus, meters (for example, meters of a car, an aircraft, and a ship), a flight simulator, and a network server.

Fifth Embodiment

Next, a vehicle according to a fifth embodiment of the invention will be described.

Figure 12:
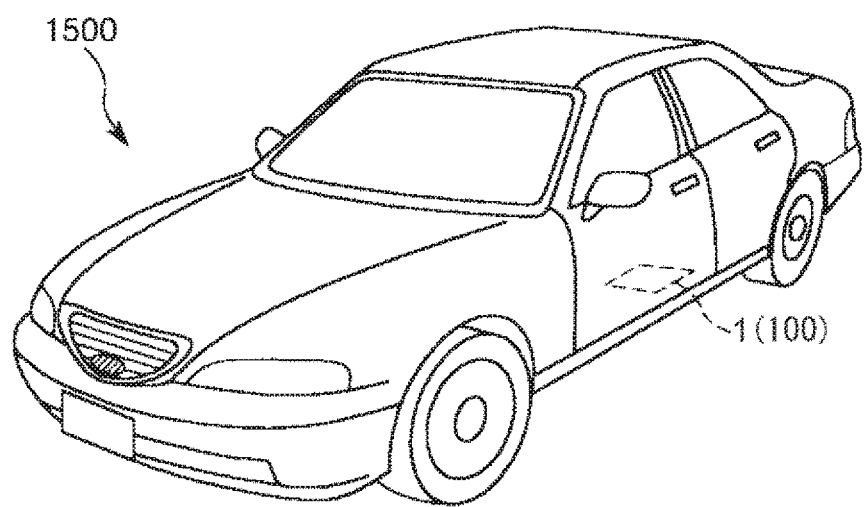
FIG. 12 is a perspective view illustrating a vehicle according to a fifth embodiment of the invention.

FIG. 12 is a perspective view illustrating the vehicle according to the fifth embodiment of the invention.

An automobile 1500 illustrated in FIG. 12 is an automobile to which the vehicle including the vibrator device according to the invention is applied. In this figure, the oscillator 100 (vibrator device 1) is mounted inside the automobile 1500. The oscillator 100 (vibrator device 1) can be widely applied to, for example, a keyless entry, an immobilizer, a car navigation system, a car air conditioner, an anti-lock brake system (ABS), an air bag, a tire pressure monitoring system (TPMS), an engine control, a battery monitor of a hybrid automobile or an electric automobile, and an electronic control unit (ECU) such as a car body posture control system.

Such an automobile 1500 (vehicle) has the vibrator device 1. For this reason, the effect of the vibrator device 1 described above can be enjoyed and high reliability can be demonstrated.

The vehicle is not limited to the automobile 1500, and can also be applied to, for example, an airplane, a ship, an automatic guided vehicle (AGV), a bipedal walking robot, and an unmanned airplane such as a drone.

Although the vibrator device, the oscillator, the electronic device, and the vehicle according to the invention have been described hereinbefore based on the illustrated embodiments, the invention is not limited thereto. A configuration of each unit can be substituted with any configuration having the same function. Any other configuration elements may be added to the invention. In addition, the invention may be a combination of any two or more configurations (characteristics) out of each of the embodiments.

In addition, although a configuration where the vibrator device is applied to the oscillator has been described in the embodiments described above, the configuration is not limited thereto. For example, the vibrator device may be applied to a physical quantity sensor that can detect a physical quantity such as acceleration and angular velocity. In this case, for example, a vibrator element that can detect angular velocity and acceleration may be used as the vibrator element of the vibrator, and a circuit element including a drive circuit that drives the vibrator element and a detection circuit that detects a physical quantity according to an output from the vibrator element may be used as the circuit element.

The entire disclosure of Japanese Patent Application No. 2017-048332, filed Mar. 14, 2017 is expressly incorporated by reference herein.

What is claimed is:

1. A vibrator device comprising:
a base;
a vibrator that is disposed so as to overlap the base and includes a vibrator element and a vibrator element package, which accommodates the vibrator element and has a first terminal on a surface on a base side;
a circuit element that is disposed between the base and the vibrator and has a first connection pad on a surface on a vibrator side; and
a conductive connecting member that is disposed between the circuit element and the vibrator, bonds the circuit element and the vibrator together, and electrically connects the first connection pad and the first terminal together.

2. The vibrator device according to claim 1,
wherein the circuit element has
an active surface,
an insulating layer disposed on the active surface on the vibrator side, and
a wiring layer that is disposed on the insulating layer on the vibrator side and includes the first connection pad.

3. The vibrator device according to claim 1,
wherein the base has a second terminal, and
the circuit element has
a second connection pad on the surface on the vibrator side, and
a wire that electrically connects the second terminal and the second connection pad together.

4. The vibrator device according to claim 3,
wherein the second connection pad is disposed so as not to overlap the vibrator in plan view seen from a direction where the base, the circuit element, and the vibrator are arranged.

5. The vibrator device according to claim 3,
wherein a height of the wire from the base is lower than a height of the vibrator from the base.

6. The vibrator device according to claim 1,
wherein the vibrator element package has a base body having the first terminal and a lid bonded to the base body so as to form an accommodation space accommodating the vibrator element between the lid and the base body.

7. The vibrator device according to claim 1,
wherein the circuit element has a third connection pad that is disposed on the surface on the vibrator side and is electrically connected to the first connection pad, and
the third connection pad is disposed so as not to overlap the vibrator in plan view seen from a direction where the base, the circuit element, and the vibrator are arranged.

8. The vibrator device according to claim 1, further comprising:
   a mold portion that is disposed on the base and covers the vibrator and the circuit element.

9. The vibrator device according to claim 3, further comprising:
   a mold portion that is disposed on the base and covers the vibrator and the circuit element,
   wherein the circuit element has a third connection pad that is disposed on the surface on the vibrator side and is electrically connected to the first connection pad,
   the third connection pad is disposed so as not to overlap the vibrator in plan view seen from a direction where the base, the circuit element, and the vibrator are arranged, and
   the third connection pad is closer to a center of the circuit element than the second connection pad is in the plan view.

10. An oscillator comprising the vibrator device according to claim 1.

11. An electronic device comprising the vibrator device according to claim 1.

12. A vehicle comprising the vibrator device according to claim 1.

* * * * *